United States Patent
Wang et al.

(10) Patent No.: US 10,574,286 B2
(45) Date of Patent: Feb. 25, 2020

(54) HIGH SELECTIVITY TDD RF FRONT END

(71) Applicant: QUALCOMM Incorporated, San Diego, CA (US)

(72) Inventors: Cheng-Han Wang, San Jose, CA (US); Young Gon Kim, San Jose, CA (US); Kamal Aggarwal, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/118,222

(22) Filed: Aug. 30, 2018

(65) Prior Publication Data
US 2019/0074862 A1    Mar. 7, 2019

Related U.S. Application Data

(60) Provisional application No. 62/553,690, filed on Sep. 1, 2017.

(51) Int. Cl.
| | |
|---|---|
| *H04B 1/48* | (2006.01) |
| *H03F 3/189* | (2006.01) |
| *H03H 7/38* | (2006.01) |
| *H04B 1/3805* | (2015.01) |
| *H04L 5/14* | (2006.01) |

(52) U.S. Cl.
CPC .............. *H04B 1/48* (2013.01); *H03F 3/189* (2013.01); *H03H 7/38* (2013.01); *H04B 1/3805* (2013.01); *H04L 5/14* (2013.01); *H03F 2200/294* (2013.01); *H03F 2200/318* (2013.01); *H03F 2200/451* (2013.01); *H03H 2007/386* (2013.01)

(58) Field of Classification Search
CPC .. H03H 2007/386; H03H 7/38; H04B 1/0458; H04B 1/10; H04B 1/525
See application file for complete search history.

(56) References Cited

U.S. PATENT DOCUMENTS

| | | | |
|---|---|---|---|
| 6,919,858 B2* | 7/2005 | Rofougaran | H04B 1/18 343/700 MS |
| 7,129,803 B2* | 10/2006 | Khorram | H03H 7/38 333/25 |
| 7,683,851 B2* | 3/2010 | Rofougaran | H03F 3/211 343/850 |
| 8,489,035 B2* | 7/2013 | Chiang | H03F 3/24 330/10 |

(Continued)

FOREIGN PATENT DOCUMENTS

| | | |
|---|---|---|
| WO | 2016182691 A1 | 11/2016 |
| WO | 2017008994 A1 | 1/2017 |
| WO | 2017009793 A1 | 1/2017 |

OTHER PUBLICATIONS

International Search Report and Written Opinion—PCT/US2018/049150—ISA/EPO—dated Nov. 26, 2018.

*Primary Examiner* — Devan A Sandiford

(57) ABSTRACT

An RF front end provides high receive selectivity by selectively configuring matching networks within a Time Division Duplex transceiver. One or more elements of the transmit or receive signal paths are configured to perform multiple functions. Each of the functions can be performed in dependence on an operating mode of the RF front end. In some embodiments, one or more elements in the transmit or receive signal paths are reconfigured during receive portions of operation to provide additional receive selectivity.

22 Claims, 9 Drawing Sheets

(56) References Cited

U.S. PATENT DOCUMENTS

| | | | |
|---|---|---|---|
| 9,065,542 B2* | 6/2015 | Chee | H04B 1/525 |
| 2005/0208901 A1* | 9/2005 | Chiu | H04B 1/18 |
| | | | 455/78 |
| 2005/0208917 A1* | 9/2005 | Roufoogaran | H04B 1/0458 |
| | | | 455/296 |
| 2007/0207746 A1* | 9/2007 | Huang | H04B 1/0458 |
| | | | 455/78 |
| 2011/0169587 A1* | 7/2011 | Wang | H04B 1/52 |
| | | | 333/124 |
| 2012/0112852 A1* | 5/2012 | Manssen | H03H 7/40 |
| | | | 333/105 |
| 2012/0295559 A1* | 11/2012 | Kwok | H04B 1/48 |
| | | | 455/83 |
| 2013/0078931 A1* | 3/2013 | Jerng | H04B 1/0458 |
| | | | 455/78 |
| 2013/0258911 A1* | 10/2013 | Choksi | H03H 7/09 |
| | | | 370/277 |
| 2014/0177686 A1* | 6/2014 | Greene | H04B 1/18 |
| | | | 375/219 |
| 2014/0199951 A1* | 7/2014 | Yu | H04B 1/44 |
| | | | 455/83 |
| 2015/0094117 A1* | 4/2015 | Conta | H04B 1/525 |
| | | | 455/560 |
| 2015/0116033 A1* | 4/2015 | Spiegel | H03F 1/565 |
| | | | 330/196 |
| 2016/0336983 A1* | 11/2016 | Wang | H04B 1/1027 |
| 2017/0019135 A1* | 1/2017 | Kwok | H04B 1/1027 |
| 2017/0019140 A1* | 1/2017 | Nick | H01L 23/66 |
| 2017/0077984 A1* | 3/2017 | Esmaeilzadeh Najari | H04B 1/48 |
| 2019/0074862 A1* | 3/2019 | Wang | H03F 3/189 |
| 2019/0165754 A1* | 5/2019 | Zolomy | H03H 7/40 |

\* cited by examiner

HIGH SELECTIVITY TDD RF FRONT END

TECHNICAL FIELD

The invention relates to RF transceivers. More specifically, the invention relates to a high selectivity RF front end in a Time Division Duplex (TDD) transceiver.

BACKGROUND

Time Division Duplexing (TDD) is a technique that permits a system to share the same channel in time. From the perspective of an individual wireless transceiver, access to a channel is divided in time into transmit and receive opportunities. During transmit opportunities, the transceiver is configured to transmit over the channel, and during receive opportunities, the transceiver is configured to receive signals over the channel. As communication systems move to digital modulation and packet-based communications, TDD provides users with seemingly continuous channel access and the appearance of full duplex operation while conserving spectrum resources.

Wireless devices operate over a very small slice of an increasingly crowded spectrum. Devices operating outside of an operating band of a user device may contribute to interference experienced by the user device. Managing and controlling the extent to which an out of band interference source degrades device performance is a continual development effort. Moreover, the desire to design and implement devices that are less costly, smaller, and have higher performance produces potentially conflicting design criteria.

SUMMARY

A RF front end for a TDD transceiver is described herein. In one aspect, the RF front end includes a Transmit/Receive (T/R) switch, configured to control an operating mode of at least a portion of the RF front end, and an output matching network having at least one variable reactance element, the variable reactance element configured to resonate with at least one additional element in the output matching network, at a frequency outside of the operating band, in dependence on the operating mode, and a value of the at least one variable reactance element in dependence on the operating mode. The resonance produces a notch filter response at the resonant frequency.

The variable reactance element can be configured as a variable capacitor. The at least one additional element in the output matching network can be a transformer having a primary and a secondary. As used herein, the terms "primary" and "secondary" refer, in the context of a transformer, to the primary windings of the transformer and the secondary windings of the transformer, respectively. The secondary can be coupled to an output of the output matching network and the variable capacitor is coupled across the primary of the transformer.

In another aspect, the RF front end includes an input matching network for a Low Noise Amplifier of the TDD transceiver. The input matching network includes a shunt inductor in series with a capacitor. The shunt inductor and capacitor resonate at a frequency below the operating band to create a notch filter.

In another aspect, the RF front end includes a matching network configured to provide a notch, or band reject, response in an interference band. The interference band may be a predetermined operating band of a wireless system.

DETAILED DESCRIPTION

Figure 1:
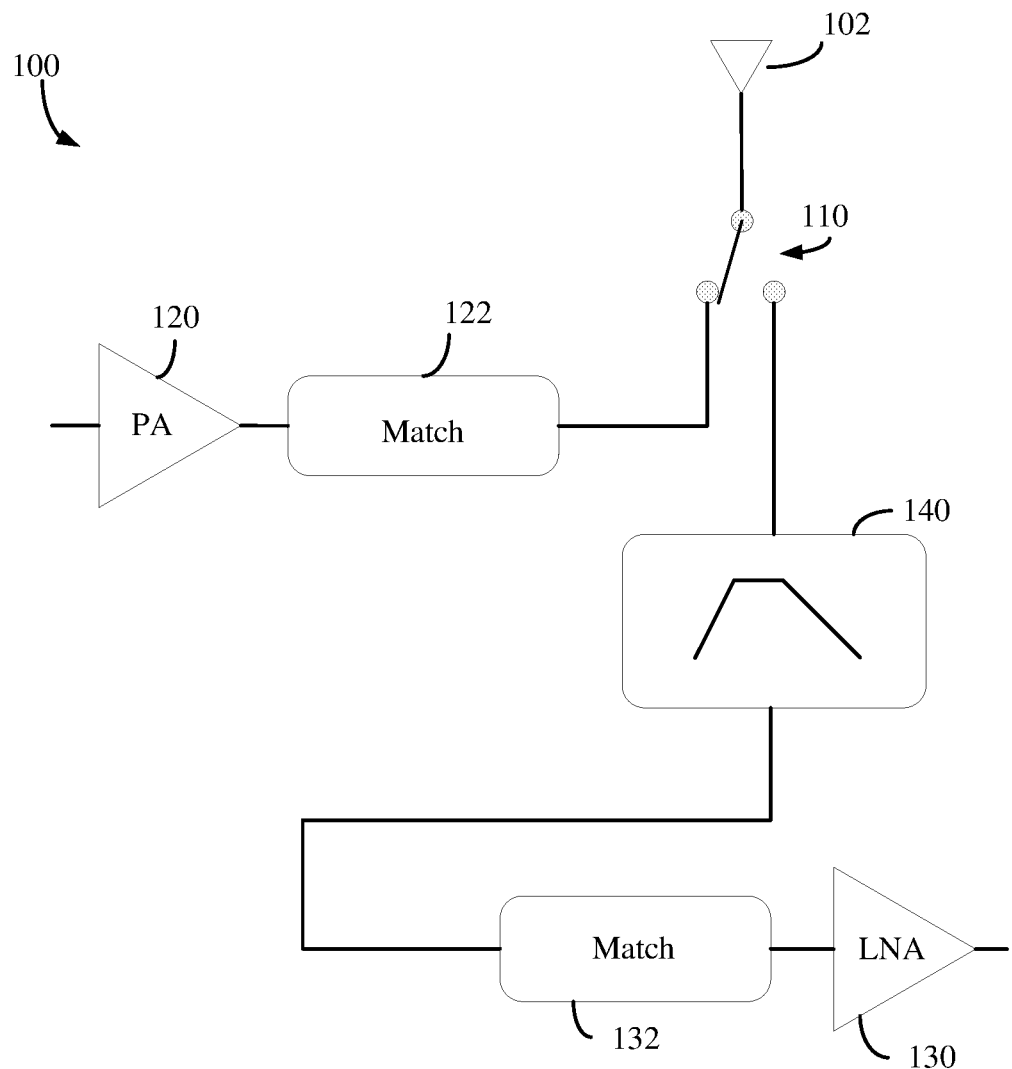
FIG. 1 is a functional block diagram illustrating an example of a TDD RF transceiver front end.

FIG. 1 is a functional block diagram of an example of a prior art TDD RF front end 100. Only the RF front end portion is detailed in FIG. 1, and additional portions of the transceiver and associated device are omitted for the sake of brevity and clarity.

The RF front end 100 includes an antenna 102 coupled to a Transmit/Receive (T/R) switch 110. The T/R switch 110 illustrated in FIG. 1 represents an RF switch that can be alternately configured to support either transmit or receive operations. During transmit operations, a Power Amplifier (PA) 120 is configured to receive uplink RF signals and amplify them for transmission over the channel to a remote receiver. The output of the PA 120 is coupled to an output matching network 122. The output matching network 122 can include one or more passive elements and may be configured to match the complex impedance at the output of the PA 120 to a characteristic impedance across an operating band that includes the frequency of the channel. Typically, the characteristic impedance is 50 ohms, although the characteristic impedance may be some other real or complex impedance. The output matching network 122 may be configured to match the output impedance of the PA 120 to the characteristic impedance within a desired tolerance. The desired tolerance may be characterized by, for example, a Voltage Standing Wave Ratio (VSWR). The output matching network 122 may be configured to match the output impedance of the PA 120 to the characteristic impedance within a VSWR of 2:1, 1.5:1, or some other VSWR tolerance across the operating band. The output of the output matching network 122 is coupled to a transmit terminal of the T/R switch 110. When the T/R switch 110 is configured to transmit mode, as illustrated in FIG. 1, transmit signals are coupled to the antenna 102 for transmission over the channel.

The T/R switch 110 is configured to couple signals received from the antenna 102 to a receive terminal of the T/R switch 110. Signals received by the antenna 102 may include many undesired signals, particularly if the antenna 102 is configured to support one or more additional wireless communication transmitters, receivers, and/or transceivers (not shown) that may operate concurrently with the RF front end 100. The output from the T/R switch 110 may be coupled to a receive filter 140 configured to attenuate undesired signals received by the antenna 102. The receive filter 140 may be configured as one or more filters, and each of the one or more filters may be configured as a bandpass filter, a band reject filter, a lowpass filter, or a highpass filter. The configuration of the receive filter 140 may depend on the operating band and potential sources and magnitudes of interfering signals outside the operating band and outside the desired channel.

The output of the receive filter 140 is coupled to an input matching network 132. The input matching network 132 is configured to match the input impedance of a Low Noise Amplifier (LNA) 130 to a characteristic impedance. The input matching network 132 can include one or more passive elements and may be configured to match the complex impedance at the input of the LNA 130 to a characteristic impedance across an operating band that includes the frequency of the channel. In a functionally similar way to the output matching network 122 in the transmit path, the input matching network 132 may be configured to match the input impedance of the LNA 130 to the characteristic impedance within a VSWR of 2:1, 1.5:1, or some other VSWR tolerance across the operating band. The output of the input matching network 132 is configured to couple the receive signal to an input of the LNA 130. The LNA 130 operates to amplify the receive signals for further processing.

A RF front end for a TDD transceiver is disclosed herein that contributes to satisfying the continuing quest for improved performance with reduced size and cost. The disclosed RF front end provides high receive selectivity while utilizing fewer elements compared to prior embodiments. In the disclosed embodiments, one or more elements of the transmit or receive signal paths are configured to perform multiple functions. In some embodiments, one or more elements in the transmit or receive signal paths are reconfigured during receive portions of operation to provide additional receive selectivity.

The disclosed RF front end may be implemented in TDD transceivers in support of various wireless communication systems across a variety of communication standards. TDD transceivers may be implemented in support of Wireless Local Area Networks (WLAN) or Wireless Wide Area Networks (WAN), and examples of such wireless communication systems are described below. The wireless systems described herein represent illustrative and not exhaustive examples of TDD systems in which the disclosed RF front end may be implemented.

Figure 2:
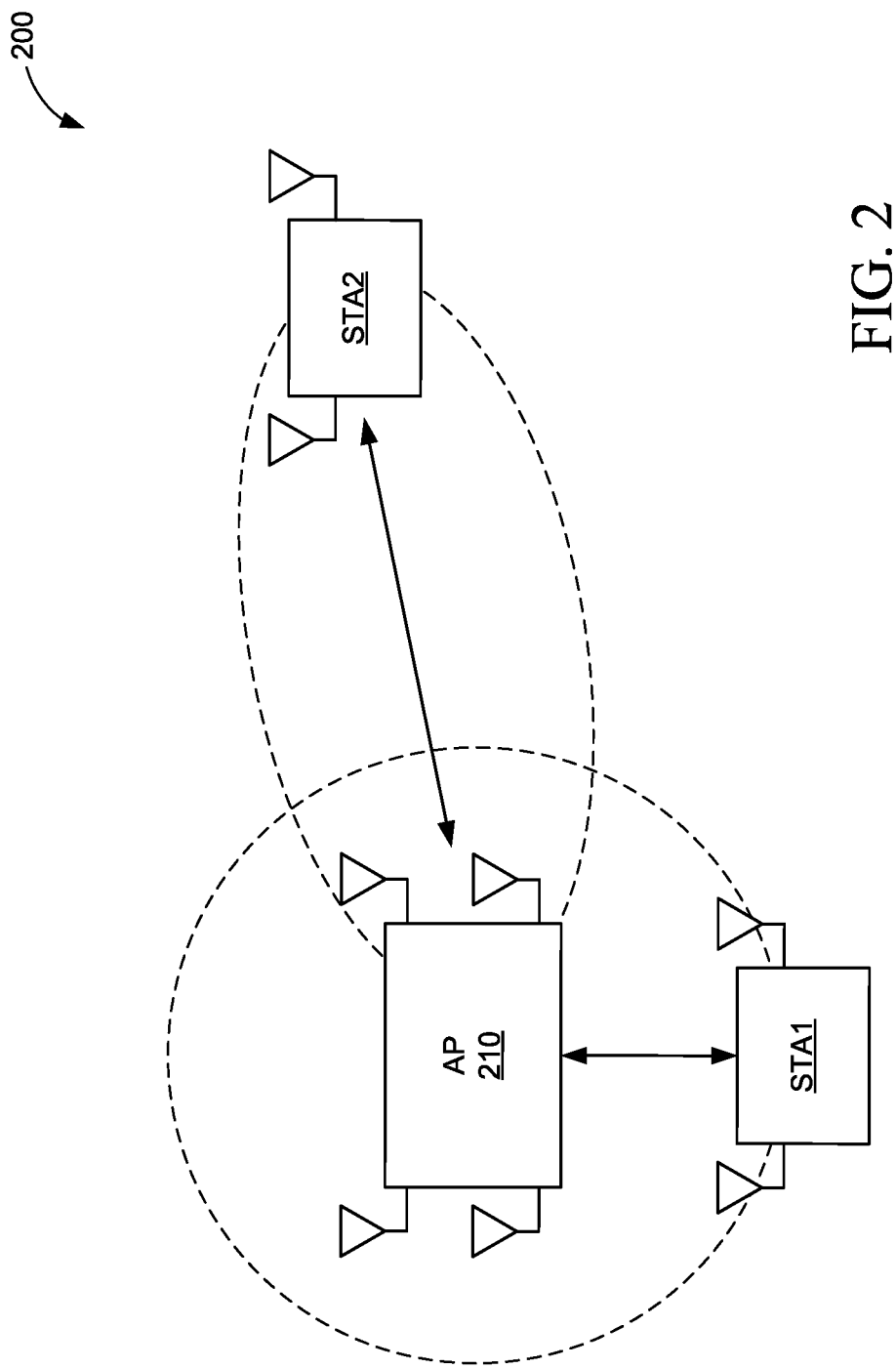
FIG. 2 is a functional block diagram illustrating an example of an access network.

FIG. 2 shows a block diagram of a communications system 200 within which the example embodiments may be implemented. The communications system 200 is shown to include a wireless access point (AP) 210 and two wireless stations STA1 and STA2. The AP 210 and wireless stations STA1 and STA2 may operate according to the IEEE 802.11 family of standards (or according to other suitable wireless protocols).

The AP 210 may be any suitable device that allows one or more wireless devices to connect to a network (e.g., a local area network (LAN), wide area network (WAN), metropolitan area network (MAN), and/or the Internet) via the AP 210 using Wi-Fi, Bluetooth, or any other suitable wireless communication standards. The AP 210 may be assigned a unique media access control (MAC) address that is programmed therein by, for example, a device manufacturer. For some embodiments, the AP 210 may be any suitable wireless device (e.g., such as a wireless STA) acting as a software-enabled access point ("SoftAP"). For at least one embodiment, the AP 210 may include a plurality of transceivers, one or more processing resources (e.g., processors and/or ASICs), one or more memory resources, and a power source.

Each of the stations STA1 and STA2 may be any suitable Wi-Fi enabled wireless device including, for example, a cell phone, personal digital assistant (PDA), tablet device, laptop computer, or the like. Each of the stations STA1 and STA2, may be configured with a TDD RF front end as described herein.

Each of the stations STA1 and STA2 may also be referred to as a user equipment (UE), a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. Each station STA1 and STA2 may also be assigned a unique MAC address. For at least some embodiments, the stations STA1 and STA2 may include one or more transceivers, one or more processing resources (e.g., processors and/or ASICs), one or more memory resources, and a power source (e.g., a battery). The memory resources may include a non-transitory computer-readable medium (e.g., one or more nonvolatile memory elements, such as EPROM, EEPROM, Flash memory, a hard drive, etc.) that stores instructions for performing operations described below with respect to FIG. 7.

For the AP 210 and/or stations STA1 and STA2, the one or more transceivers may include Wi-Fi transceivers, Bluetooth transceivers, near field communication (NFC) transceivers, cellular transceivers, and/or other suitable radio frequency (RF) transceivers (not shown for simplicity) to transmit and receive wireless communication signals. Each transceiver may communicate with other wireless devices in distinct operating frequency bands and/or using distinct communication protocols. For example, the Wi-Fi transceiver may communicate within a 2.4 GHz frequency band and/or within a 5 GHz frequency band in accordance with the IEEE 802.11 specification. The cellular transceiver may communicate within various RF frequency bands in accordance with a 4G Long Term Evolution (LTE) protocol described by the 3rd Generation Partnership Project (3GPP) (e.g., between approximately 700 MHz and approximately 3.9 GHz) and/or in accordance with other cellular protocols (e.g., a Global System for Mobile (GSM) communications protocol). In other embodiments, the transceivers may be any technically feasible transceiver such as a ZigBee transceiver described by the ZigBee specification, a WiGig transceiver, and/or a HomePlug transceiver described in a specification from the HomePlug Alliance.

The example embodiments are described below in the context of wireless local area network (WLAN) systems for simplicity only. It is to be understood that the example embodiments are equally applicable to other wireless networks (e.g., cellular networks, pico networks, femto networks, satellite networks), as well as for systems using signals of one or more wired standards or protocols (e.g., Ethernet and/or HomePlug/PLC standards). As used herein, the terms "WLAN" and "Wi-Fi®" may include communications governed by the IEEE 802.11 family of standards, BLUETOOTH® (Bluetooth), HiperLAN (a set of wireless standards, comparable to the IEEE 802.11 standards, used primarily in Europe), and other technologies having relatively short radio propagation range. Thus, the terms "WLAN" and "Wi-Fi" may be used interchangeably herein. In addition, although described below in terms of an infrastructure WLAN system including one or more APs and a number of STAs, the example embodiments are equally applicable to other WLAN systems including, for example, multiple WLANs, peer-to-peer (or Independent Basic Service Set) systems, Wi-Fi Direct systems, and/or Hotspots.

Figure 3:
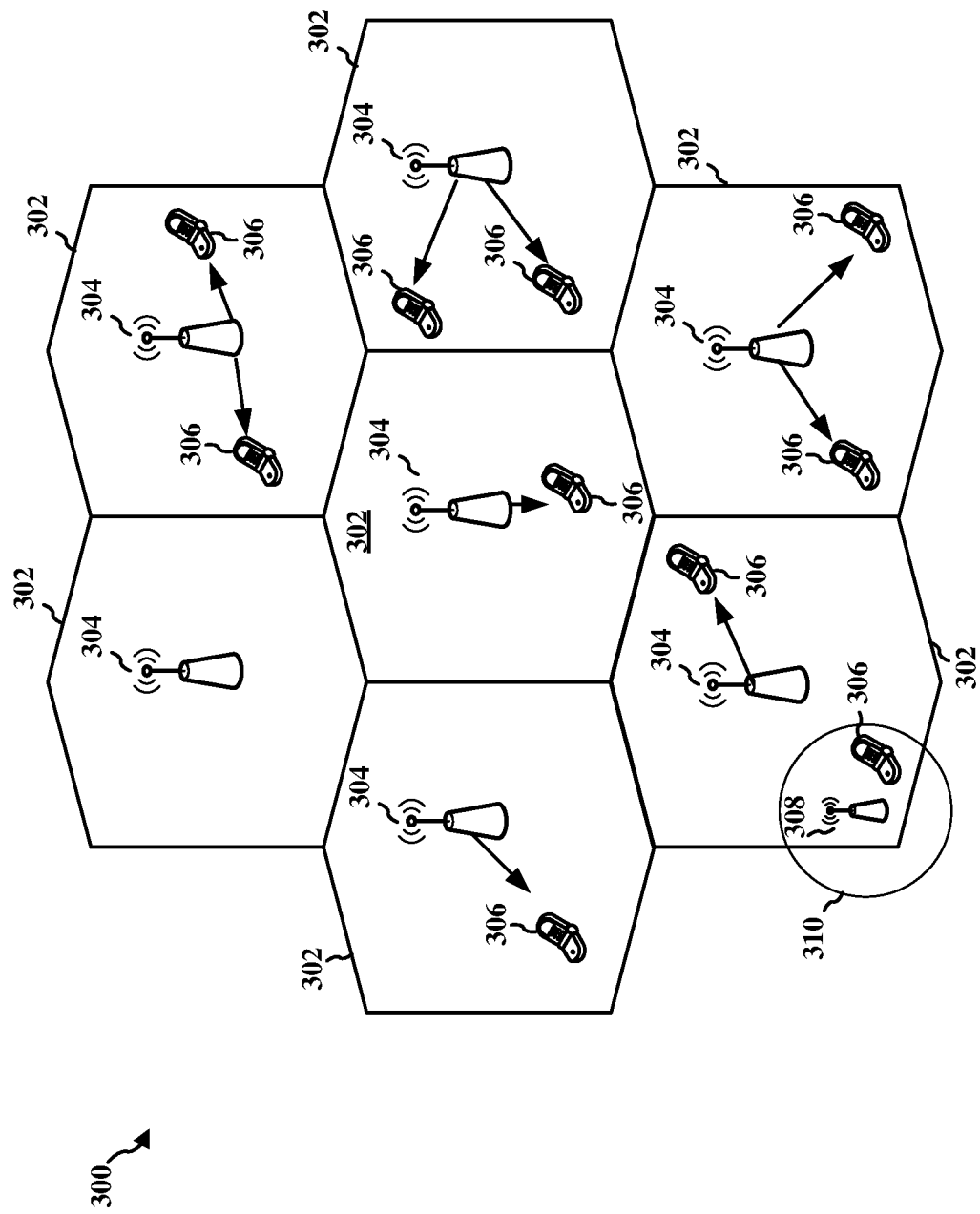
FIG. 3 is a functional block diagram illustrating an example of an access network.

FIG. 3 is a diagram illustrating an example of an access network 300 in an LTE network architecture. In this example, the access network 300 is divided into a number of cellular regions (cells) 302. One or more lower power class eNBs 308 may have cellular regions 310 that overlap with one or more of the cells 302. The lower power class eNB 308 may be a femto cell (e.g., home eNB (HeNB)), pico cell, micro cell, or remote radio head (RRH). The macro eNBs 304 are each assigned to a respective cell 302 and are configured to provide an access point to an Evolved Packet Core for all the UEs 306 in the cells 302. There is no centralized controller in this example of an access network 300, but a centralized controller may be used in alternative configurations. The eNBs 304 are responsible for all radio related functions including radio bearer control, admission control, mobility control, scheduling, security, and connectivity to a serving gateway. An eNB may support one or multiple (e.g., three) cells (also referred to as a sector). The term "cell" can refer to the smallest coverage area of an eNB and/or an eNB subsystem serving are particular coverage area. Further, the terms "eNB," "base station," and "cell" may be used interchangeably herein.

The modulation and multiple access scheme employed by the access network 300 may vary depending on the particular telecommunications standard being deployed. In LTE applications, OFDM is used on the DL and SC-FDMA is used on the UL to support both frequency division duplex (FDD) and time division duplex (TDD).

The various concepts presented herein are well suited for LTE applications in TDD systems. However, these concepts may be readily extended to other telecommunication standards employing other modulation and multiple access techniques. By way of example, these concepts may be extended to Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. These concepts may also be extended to Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), IEEE 802.11 (Wi-Fi), IEEE 802.16 (WiMAX), IEEE 802.20, and Flash-OFDM employing OFDMA. UTRA, E-UTRA, UMTS, LTE and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

Figure 4A:
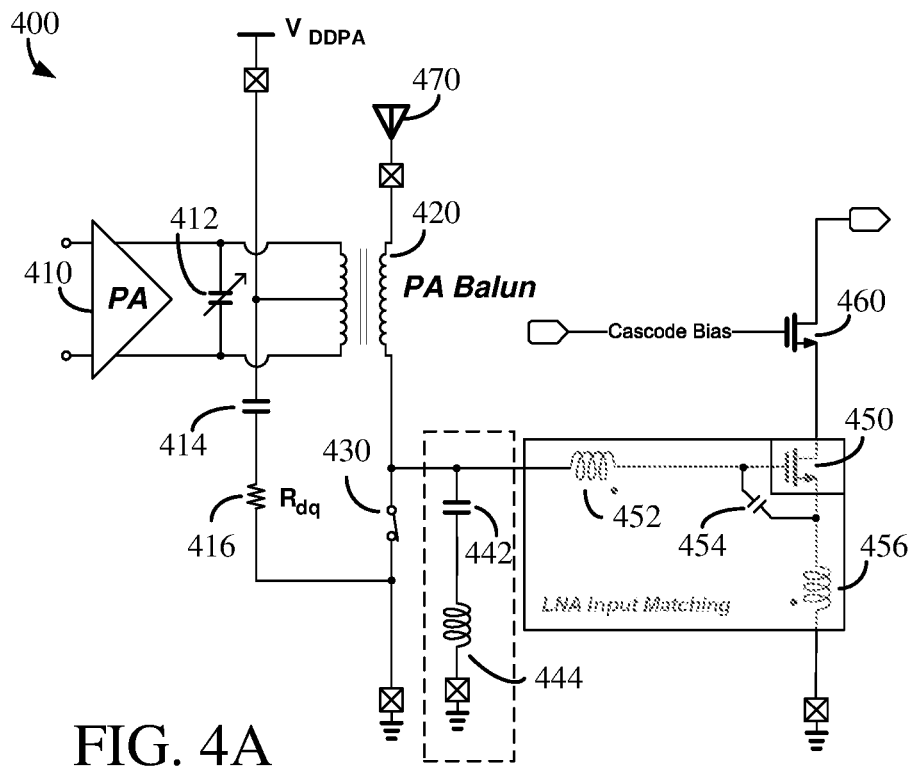
FIGS. 4A-4B are functional block diagrams of an example of a TDD RF front end.
Figure 4B:
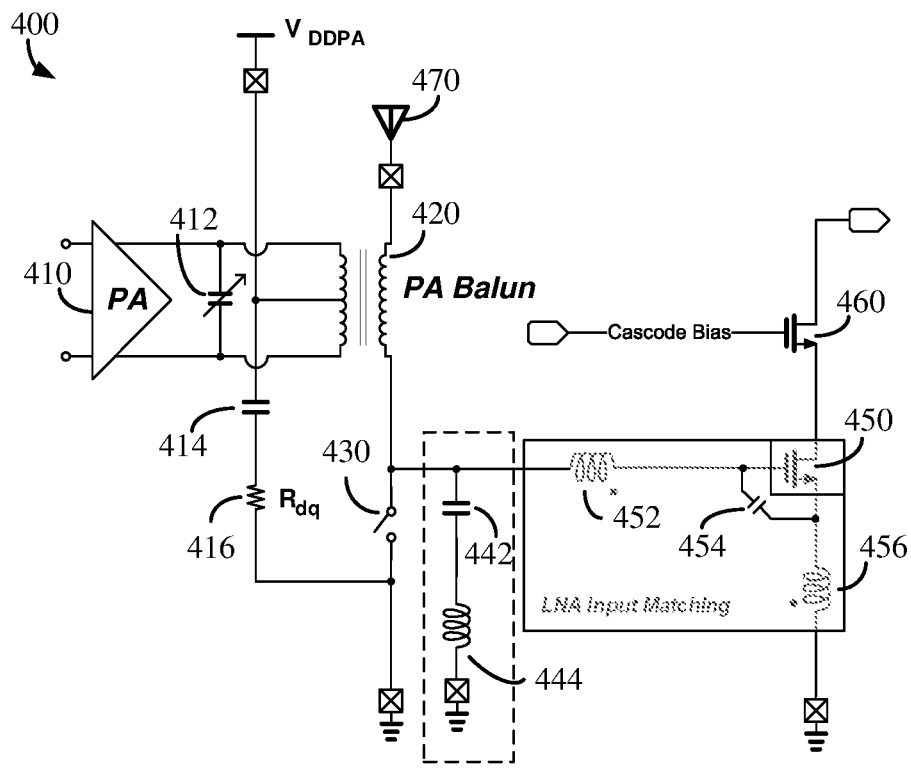

FIGS. 4A-4B are functional block diagrams of an example of a TDD RF front end 400. FIG. 4A illustrates the example of the RF front end 400 configured to support transmit mode. FIG. 4B illustrates the RF front end 400 configured to support receive mode. The RF front end 400 of FIGS. 4A and 4B illustrates an embodiment in which portions of the PA output matching network are configured to provide additional frequency selectivity to the receiver during receive operation. Configuring the PA matching network to provide additional frequency selectivity to the receiver may relax the receive filter requirements, enabling a reduction or elimination of portions or all of a receive filter. Relaxing the receive filter requirements may result in reduced area requirements for the RF front end 400. The receiver performance may also be improved by enabling the implementation of a receive filter having a lower insertion loss. Decreasing the insertion loss of the receive filter may degrade the Noise Figure of the receiver, and thereby increase the receive sensitivity.

The RF front end 400 includes transmit portions and receive portions. As before, only a portion of the RF front end 400 is detailed in FIGS. 4A-4B. Additional portions of the transceiver and associated device are omitted for the sake of brevity and clarity.

The transmit portion includes an amplifier that may be configured to receive a transmit RF signal and amplify the signal. The amplifier may be configured as a PA 410. The PA 410 is illustrated as a balanced PA, but other configurations may utilize a single-ended configuration. The PA 410 is illustrated as a single amplifier, but the PA 410 may be implemented in a variety of configurations, and the configuration of the PA 410 may depend on design constraints of the device in which the PA 410 is implemented. The PA 410 may be, for example, a single transistor, multiple transistors, a PA module, a plurality of PA modules, and the like, or some other means for amplifying a transmit signal.

The output of the PA 410 may be coupled to an output matching network. The output matching network can include one or more passive elements. The output matching network may include a capacitor 412 and a transformer. Where the PA 410 has a balanced output, the transformer can be configured as a PA balun 420. The capacitor 412 may be coupled across the output terminals of the PA 410 and across the primary of the PA balun 420. As used herein in relation to a transformer, such as the PA balun 420, the terms "primary" and "secondary" refer, respectively, to a primary winding and a secondary winding.

The primary of the PA balun 420 can be configured with a center tap. The center tap is coupled to a voltage source configured to provide a power supply voltage to corresponding terminals of the PA 410. A second capacitor 414 has a first terminal coupled to a node common to the center tap and power supply. A second terminal of the second capacitor 414 is coupled to a first terminal of a resistor 416. A second terminal of the resistor 416 is coupled to ground.

In some embodiments, the second capacitor 414 is configured as a bypass capacitor. In other embodiments, the second capacitor 414 is configured as a portion of the output matching network. The resistor 416 can be configured to reduce the quality factor (Q) of the PA balun 420. Reducing the Q of the PA balun 420 may be desirable depending on the bandwidth over which the output matching network is configured to operate. In other embodiments, the resistor 416 may be omitted, and the second terminal of the capacitor 414 may be coupled to ground.

The secondary of the PA balun 420 has a first terminal coupled to an antenna 470. There may be other components disposed between the secondary of the PA balun 420 and the antenna 470. These additional components are omitted for the sake of brevity and clarity. A second terminal of the secondary of the PA balun 420 is coupled to a first terminal of a T/R switch 430. A second terminal of the T/R switch 430 is coupled to ground, alternatively referred to as common, voltage common, return, or voltage return.

The first terminal of the T/R switch 430 is also coupled to the receive portion of the RF front end 400. Thus, the receiver is coupled to the antenna 470 via the secondary of the PA balun 420.

The receive portion of the RF front end 400 includes a filter configured to increase receive selectivity. In the configuration of FIGS. 4A and 4B, the receive filter is configured as a notch filter, which alternatively may be referred to as a band reject filter. The notch filter may be configured as a filter capacitor 442 in series with a filter inductor 444. The values of the filter capacitor 442 and filter inductor 444 are selected such that the filter has a series resonance at a desired notch frequency.

The shunt notch filter configuration illustrated in FIGS. 4A and 4B may reduce insertion loss attributable to the filter and may reduce the impact of the filter on the characteristic impedance of the receive signal path. In other embodiments, the filter may be implemented as a series filter or as a filter having both series and shunt elements. In such embodiments, the filter may be configured to operate at the characteristic impedance of the receive signal path.

The receive portion of the RF front end 400 includes an input matching network having an input coupled to the node common to the first terminal of the T/R switch 430 and the second terminal of the secondary of the PA balun 420. The input matching network is configured to match the input of an LNA transistor 450 to a characteristic impedance. The input matching network may include one or more passive elements, and the passive elements may be configured to provide an impedance match over a desired operating bandwidth. As an example, the input matching network can be configured to match the input of the LNA transistor 450 to a characteristic impedance within a VSWR of 2:1, 1.5:1, or some other VSWR tolerance across the operating band.

The input matching network includes a first matching inductor 452 having a first terminal coupled to the input of the input matching network. A second terminal of the first matching inductor 452 is coupled to an input of an LNA. In the embodiment of FIG. 4A-4B, the input of the LNA is a gate of LNA transistor 450.

The second terminal of the first matching inductor 452 is also coupled to a first terminal of an input matching capacitor 454. A second terminal of the input matching capacitor 454 is coupled to the source of the LNA transistor 450. The source of the LNA transistor 450 is coupled to a first terminal of a second matching inductor 456. A second terminal of the second matching inductor 456 is coupled to ground.

The first matching inductor 452 and second matching inductor 456 may be implemented as individual inductors or may be implemented as a transformer. When implemented as a transformer, the transformer windings have the polarity of the indicated by the dots on the first matching inductor 452 and second matching inductor 456.

The second matching inductor 456 operates as a source degeneration inductor. The second matching inductor 456 and its contribution to the input match is based at least in part on characteristics of the LNA transistor as well as the coupling between the first matching inductor 452 and the second matching inductor 456.

The drain of the LNA transistor 450 is coupled to a cascode transistor 460. The cascode transistor 460 can be configured as an N-channel transistor coupled in cascode to the LNA transistor 450. The gate of the cascode transistor 460 may be biased with a cascode bias voltage and the drain of the cascode transistor 460 provides the RF output. The cascode transistor 460 is optional, and some implementations of the LNA may omit the cascode transistor 460. In such embodiments, the drain of the LNA transistor 450 provides the LNA output.

The T/R switch 430 can be configured as a single-pole single-throw (SPST) switch. FIG. 4A illustrates the T/R switch 430 configured in the closed configuration. In this configuration, the two terminals of the T/R switch 430 are electrically connected. This condition represents the transmit configuration.

In the transmit configuration, the T/R switch 430 grounds the input to the input matching network, and thus, prevents signal from coupling to the LNA transistor 450. Simultaneously, the T/R switch 430 couples the secondary of the PA balun 420 to ground, and enables coupling of the transmit signal from the output of the PA 410 to the antenna 470 while avoiding coupling energy from the transmit signal to LNA transistor 450.

During the transmit configuration, the matching capacitor 412 in the PA output matching network is configured, in conjunction with the PA balun 420, to provide a match to the output of the PA 410. The values of the capacitor 412 and inductance values of the PA balun 420 can be configured to provide an impedance match over a desired operating bandwidth. As an example, the capacitor 412 and PA balun 420 can be configured to provide a match to a characteristic impedance within a VSWR of 2:1, 1.5:1, or some other VSWR tolerance across the operating band. In some configurations, the capacitor 412 may be configured as a variable capacitor. A processor may be configured to adjust the value of the capacitor 412 to a predetermined value when operating in the transmit configuration. That is, prior to, or subsequent to switching the T/R switch 430 into the transmit configuration, the processor adjusts the value of the capacitor 412 to a predetermined capacitance to provide the desired output match. The capacitor 412 may be implemented, for example, as a switchable capacitor bank, a varactor, a three-terminal transcap, a MOScap, a fixed capacitor in combination with a variable capacitor, and the like, or some other means for varying a capacitance.

The value of the capacitor 412 when the RF front end 400 is configured to support transmit operation may be referred to as an initial, primary, or default value. Because the capacitor 412 forms part of the output matching network for the PA 410, its primary value may be its value for transmit operation.

Although FIG. 4A is described as having a variable capacitor 412, in general, the output matching network may be configured with a variable reactance element. The variable reactance element can be configured in the first, or transmit mode to support the output match. In the second or receive mode, the variable reactance element can be configured to resonate with at least one additional element in the output matching network. In the example of FIG. 4A-4B, the variable reactance element is configured as a variable capacitor 412, and the at least one additional element from the output matching network is configured as the primary of the PA balun 420.

FIG. 4B illustrates the RF front end 400 configured for receive operation. The elements of the RF front end 400 are the same in FIGS. 4A and 4B, the only difference being the position of the T/R switch 430 and the configuration of the PA 410 output matching network. The description of FIG. 4B will not repeat the description of those elements described previously and will instead focus on the differences.

As described previously, the T/R switch 430 is in the open circuit configuration during receive mode of operation. When the T/R switch 430 is in the open circuit configuration, the input matching network of the LNA is coupled to the antenna 470 via the secondary of the PA balun 420. The T/R switch 430 no longer operates to pull the input of the LNA to ground, and thus, the input matching network and LNA transistor 450 are enabled to operate on received signals.

The capacitor 412 of the PA 410 output matching network may be tuned to resonate with the PA balun 420. Selectively tuning a resonant frequency of the capacitor 412 and PA balun 420 may provide additional selectivity in the receive mode of operation. In one embodiment, the value of the capacitor is tuned to achieve a resonant frequency of the capacitor 412 and PA balun 420 at a frequency approximately twice the frequency of operation, and preferably greater than 1.5 times the operating frequency or greater than 2 times the frequency of operation. The notch response created by the resonance may have little impact on the passband response at the desired receive operating band, provided the resonant frequency is offset a sufficient frequency from the desired operating band.

As an example, a TDD front end 400 configured to support Wireless LAN, such as those illustrated in FIG. 2 and operating in accordance with IEEE 802.11b/g/n, may be configured to transmit and receive in an operating frequency of approximately 2.4-2.5 GHz. It is not unusual for a WLAN wireless transceiver to operate in a dual-mode dual-frequency environment. In such an environment, another transceiver may be configured to operate in frequencies in support of, for example, IEEE 802.11a/ac. The frequencies allocated in support of IEEE 802.11a/ac may be, for example, within a band of 5.1-5.7 GHz.

Tuning the capacitor 412 to a value that produces a resonant frequency of the capacitor 412 and PA balun 420 at slightly greater than two times the operating frequency of 2.4-2.5 GHz produces a notch, or band reject response. Tuning the value of the capacitor 412 tunes the frequency of the notch. Thus, when the RF front end 400 transitions from the transmit mode to the receive mode, a processor can be configured to tune the capacitor 412 in the PA 410 output matching network from its primary value to a secondary value. The secondary value of the capacitor 412 can be configured to produce resonance, and thus a notch filter response, at a frequency above a frequency of operation. Preferably, the notch may be centered at a frequency that is greater than 1.5 times, or greater than 2 times the operating frequency.

Thus, selectively tuning the capacitance of the capacitor 412 in the PA 410 output matching network during receive operation increases receive selectivity using existing elements of the output matching network, for example, capacitor 412 and PA balun 420. The increased receive sensitivity may obviate the need for additional filtering.

Figure 5A:
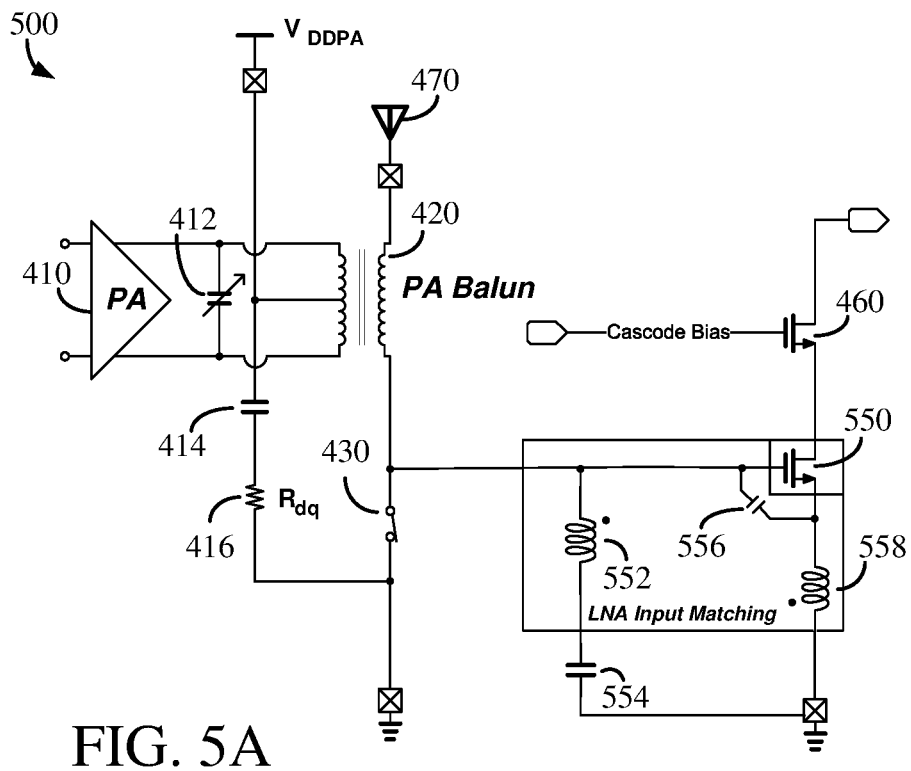
FIGS. 5A-5D are functional block diagrams of an example of a TDD RF front end.
Figure 5B:
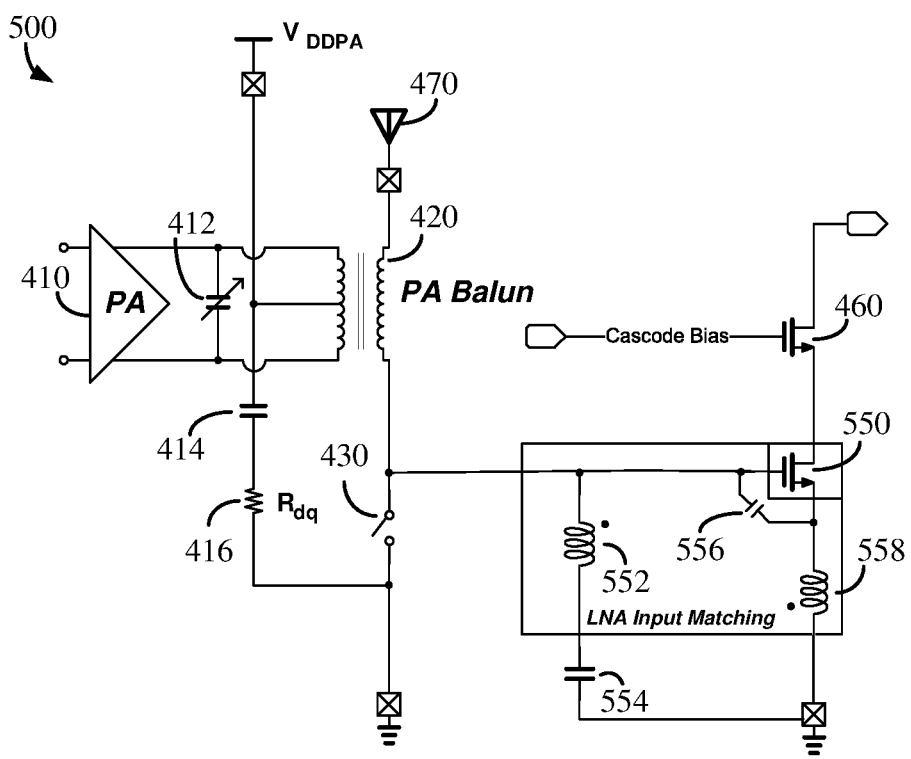
Figure 5C:
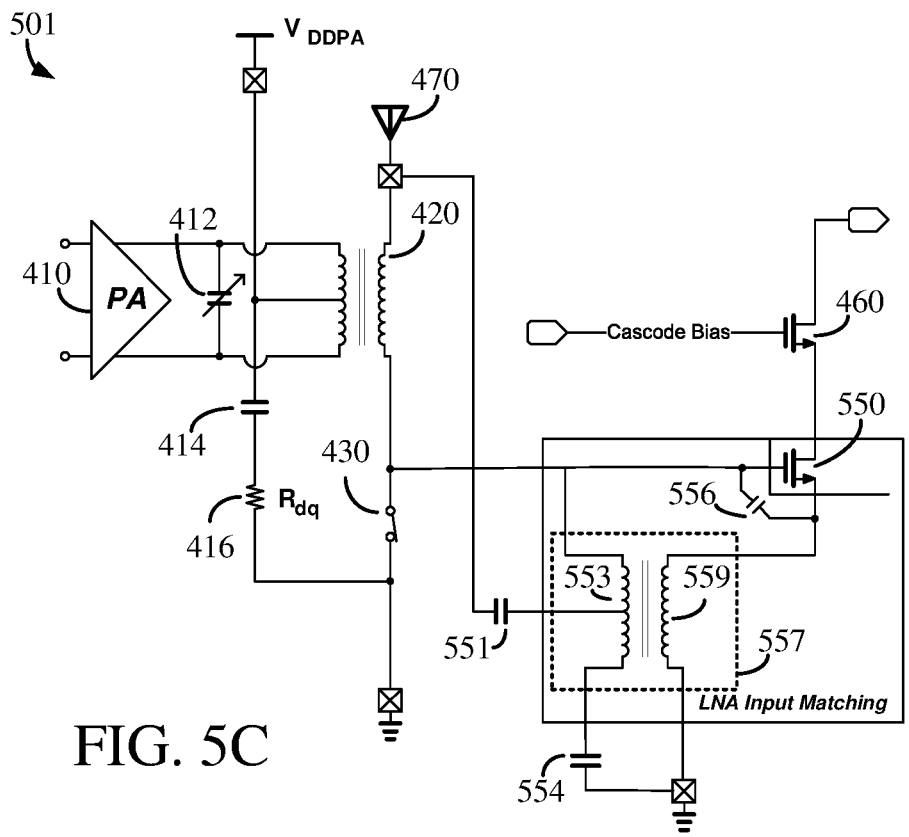
Figure 5D:
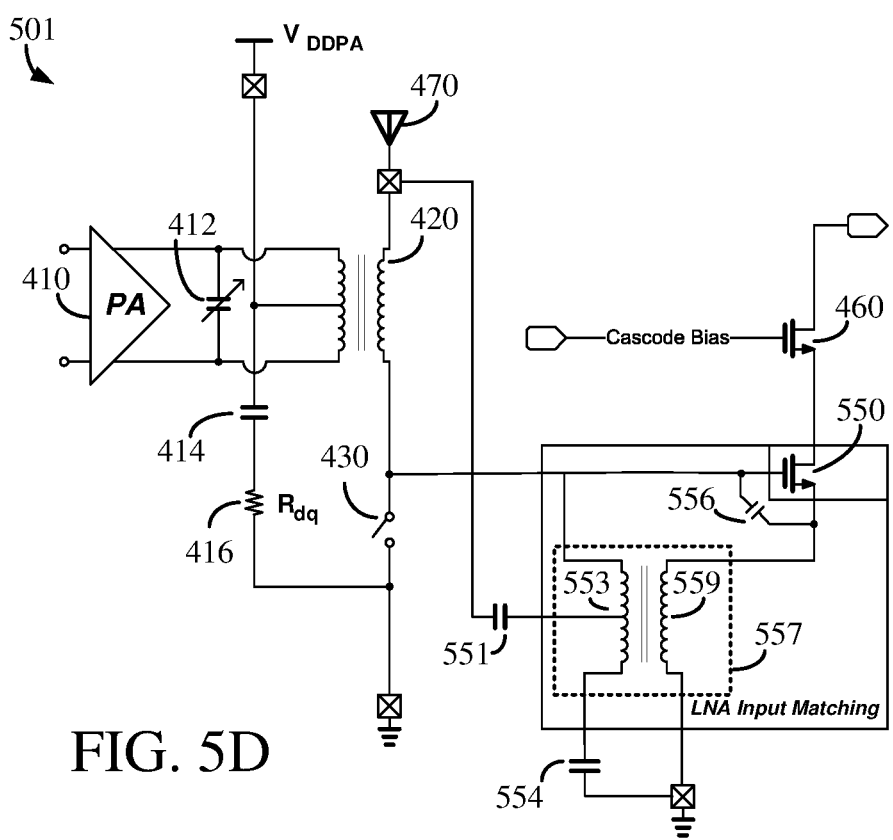

FIGS. 5A-5D are functional block diagrams of examples of a TDD RF front end 500 and 501. FIG. 5A illustrates the example of an RF front end 500 configured to support transmit operation. FIG. 5B illustrates the RF front end 500 configured to support receive operation. FIG. 5C illustrates an alternative example of an RF front end 501 configured to support transmit operation. FIG. 5D illustrates the RF front end 501 configured to support receive operation. The embodiments of the TDD RF front end 500 and 501 of FIGS. 5A through 5D are similar to the RF front end 400 configuration of FIGS. 4A and 4B. The transmit portion of the two embodiments can be the same or substantially the same.

The RF front end examples, 500 and 501, illustrated in FIGS. 5A through 5D include a modified receive configuration that provides improvements in receive selectivity that may be implemented independent of, or in conjunction with, the features described with respect to FIGS. 4A and 4B. The description of FIGS. 5A through 5D will not repeat the description of those elements described previously and will instead focus on the differences.

In the RF front end 500 embodiment of FIGS. 5A and 5B, the receive portion omits the filter, yet substantially maintains the receive selectivity performance as the RF front end 400 of FIGS. 4A and 4B. The receive portion of the RF front end 500 includes an input matching network coupled to a LNA, but, as previously mentioned, omits the filter.

In the RF front end 500, the input matching network achieves a match utilizing a shunt-L configuration rather than a series-L configuration. Further, the shunt-L configuration permits the elements of the input matching network to operate as a notch filter, thereby obviating the need for a distinct notch filter.

The input matching network for the LNA includes a shunt inductor 552 having a first terminal coupled to the node common to the first terminal of the T/R switch 430 and the second terminal of the secondary of the PA balun 420. The second terminal of the shunt inductor 552 is coupled to a first terminal of a first capacitor 554. A second terminal of the first capacitor 554 is coupled to ground.

The first terminal of the shunt inductor 552, and thus, the input to the input matching network, is also coupled to a first terminal of a second capacitor 556. A second terminal of the second capacitor 556 is coupled to the source of the LNA transistor 550. The source of the LNA transistor 550 is coupled to a first terminal of a source inductor 558. A second terminal of the source inductor 558 is coupled to ground.

The shunt inductor 552 and source inductor 558 may be implemented as individual inductors or may be implemented as a transformer. When implemented as a transformer, the transformer windings have the polarity of the indicated by the dots on the shunt inductor 552 and source inductor 558.

The drain of the LNA transistor 550 is coupled to a cascode transistor 460. The cascode transistor 460 can be configured as an N-channel transistor coupled in cascode to the LNA transistor 450. The gate of the cascode transistor 460 may be biased with a cascode bias voltage and the drain of the cascode transistor 460 provides the RF output. The cascode transistor 460 is optional, and some implementations of the LNA may omit the cascode transistor 460. In such embodiments, the drain of the LNA transistor 550 provides the LNA output.

In the example of FIG. 5A, the T/R switch 430 is configured in the closed position. The second terminal of the secondary of the PA balun 420 as well as the input to the input matching network are coupled to ground via the T/R switch 430. The capacitor 412 in the PA 410 output matching network is configured to its primary value. The amplified output from the PA 410 is coupled via the PA balun 420 to the antenna 470 for wireless transmission to a remote terminal.

FIG. 5B illustrates the RF front end 500 configured to support receive operation. The T/R switch 430 is configured in the open circuit configuration. The input of the input matching network to the LNA transistor 550 is coupled, via the secondary of the PA balun 420 to the antenna 470.

The input matching network to the LNA transistor 550 is configured to match the input of the LNA transistor 550 to a characteristic impedance. The input matching network may include, for example, one or more passive elements, and the passive elements may be configured to provide an impedance match over a desired operating bandwidth. The input matching network, and generally a matching network within the RF front end 500, may be configured to be coupled to the antenna 470. The matching network can be configured with at least one reactance element, with the reactance element configured to resonate with at least one additional element in the matching network at a frequency within an interference band. As described above in relation to FIG. 4B, a configuration of a WLAN transceiver operating in the 2.4-2.5 GHz band may view signals in the 5 GHz WLAN band as interferers. Thus, the RF front end 500 may configure the matching network to have a notch in an interference band, such as in the 5 GHz WLAN band.

As an example, the input matching network illustrated in FIGS. 5A and 5B includes a shunt inductor 552 and the second capacitor 556. The input matching network may be configured to match the input of the LNA transistor 550 to a characteristic impedance within a VSWR of 2:1, 1.5:1, or some other VSWR tolerance across the operating band.

The input matching network is configured to concurrently provide a filter response. The shunt inductor 552 and first capacitor 554 may be configured to resonate at a desired frequency. The shunt inductor 552 and first capacitor 554 produce a notch filter response at the resonant frequency at the input to the input matching network.

The resonant frequency of the shunt inductor 552 and first capacitor 554 may be configured to provide a notch filter response below or above the operating frequency. In an example, a WLAN RF front end 500 operating in the band of approximately 2.4-2.5 GHz may experience interfering signals from cellular telephones and base stations operating in the 700-900 MHz frequency band. The shunt inductor 552 and first capacitor 554 may be configured to provide a notch filter response within the 700-900 MHz frequency band. The input matching network can thus be configured to match the LNA and concurrently improve receive selectivity.

Unlike the LC filter illustrated in the embodiment of FIGS. 4A and 4B, the shunt inductor 552 in the embodiment of FIGS. 5A and 5B is an integral element in the input matching network to the LNA transistor 550. Prior art filter configurations were either designed to match the characteristic impedance of the receive signal path or have little to no impact on the impedance match.

In one embodiment, the value of the shunt inductor 552 is selected to operate in conjunction with the second capacitor 556, and optionally, the source inductor 558 to match the input impedance of the LNA transistor 550 to a characteristic impedance. The value of the first capacitor 554 can then be determined based on the frequency of the desired series resonance of the shunt inductor 552 and first capacitor 554.

The first capacitor 554 can be a fixed capacitor or a variable capacitor. Where the first capacitor 554 is configured as a variable capacitor, the variable capacitance may be implemented, for example, as a switchable capacitor bank, a varactor, a MOScap, a three-terminal transcap, a fixed capacitor in combination with a variable capacitor, and the like, or some other means for varying a capacitance.

FIGS. 5C and 5D illustrate another embodiment of an RF front end 501. Similar to the embodiment illustrated in FIGS. 5A and 5B, the RF front end 501 embodiment of FIGS. 5C and 5D omits the notch filter prior to the receive portion, yet substantially maintains the receive selectivity performance as the RF front end 400 of FIGS. 4A and 4B. The receive portion of the RF front end 501 includes an input matching network coupled to a LNA, but, as previously mentioned, omits the notch filter.

The input matching network of the RF front end 501 implements an RX input balun 557 in place of the shunt inductor 552 and source inductor 558 shown in the RF front end 500 of FIGS. 5A and 5B. The RX input balun 557 includes a primary 553 and a secondary 559. The primary 553 can be a tapped inductor. In one example implementation, the primary 553 of the RX input balun 557 can be the shunt inductor 552 shown in FIGS. 5A and 5B and the secondary 559 of the RX input balun 557 can be the source inductor 558 shown in FIGS. 5A and 5B.

The coupling capacitor 551 in conjunction with the RX input balun 557 can be configured to provide additional TX out of band emission reduction, additional RX selectivity, or both compared to the embodiment of the RF front end 500 illustrated in FIGS. 5A and 5B. The inductors in the input matching network are described as an RX input balun 557. The term RX input balun 557 is used for the sake of convenience to refer, generally, to coupled inductors where at least one of the primary 553 or secondary 559 includes a tap. As can be seen in FIGS. 5C and 5D, the RX input balun 557 is not used to interface balanced and unbalanced circuits, nor is the tap on the primary of the RX input balun 557 required to be placed at the center of the primary.

In the input matching network, a primary 553 of the RX input balun 557 is configured with a first terminal coupled to the node common to the first terminal of the T/R switch 430 and the second terminal of the secondary of the PA balun 420. The second terminal of the primary 553 of the RX input balun 557 is coupled to a first terminal of a first capacitor 554. A second terminal of the first capacitor 554 is coupled to ground. In this configuration, the primary 553 of the RX input balun operates in a similar fashion to the shunt inductor 552 of the RF front end 500 of FIGS. 4A and 4B.

The primary 553 of the RX input balun 557 can be configured as a tapped inductor. The primary tap is coupled, via a coupling capacitor 551, to the first terminal of the secondary of the PA balun 420, which is also coupled to the antenna 470.

In the example of FIG. 5C, the T/R switch 430 is configured in the closed position, and, thus, the RF front end 501 is configured to support transmit operation. The second terminal of the secondary of the PA balun 420 as well as the input to the input matching network are coupled to ground via the T/R switch 430. The path from the antenna 470 through the coupling capacitor 551 and primary 553 of the RX input balun 557 is shunted to ground at the input to the matching network by the T/R switch 430. Thus, no signal from this path is coupled to the input of the LNA transistor 550. The capacitor 412 in the PA 410 output matching network is configured to its primary value. The amplified output from the PA 410 is coupled via the PA balun 420 to the antenna 470 for wireless transmission to a remote terminal.

The coupling capacitor 551 and primary 553 of the RX input balun 557 provides a path from the antenna to ground, when the T/R switch 430 is configured in the closed position. The combination of the coupling capacitor 551 and a portion of the LNA input matching network, such as a tapped portion of the RX input balun 557, can be configured as a filter to reduce, for example, TX out of band emissions, when the T/R switch 430 is configured to support transmit operation. As an example, the value of the coupling capacitor 551 and value of inductance provided by the tapped portion of the primary 553 of the RX input balun 557 can be configured to resonate at a desired frequency or within a desired band of frequencies. In this configuration, the coupling capacitor 551 and the tapped portion of the RX input balun 557 are configured as a notch filter. The notch filter can be configured to attenuate, for example, a harmonic of the transmit signal. The harmonic can be the second harmonic, third harmonic, or some other harmonic.

The input matching network of the LNA can be configured to provide TX filtering when the T/R switch 430 in the RF front end 501 is configured to support transmit operation. When the T/R switch 430 is configured to support receive operation, the LNA input matching circuit is configured to provide input matching to the LNA and also RX selectivity.

FIG. 5D illustrates the RF front end 501 configured to support receive operation. The T/R switch 430 is configured in the open circuit configuration. The input of the input matching network to the LNA transistor 550 is coupled, via the secondary of the PA balun 420 to the antenna 470.

The primary 553 of the RX input balun 557 operates as a shunt matching element for the LNA transistor 550 and also operates in conjunction with the first capacitor 554 to provide a filter response. The primary 553 of the RX input balun 557 and first capacitor 554 may be configured to resonate at a desired frequency. The primary 553 of the RX input balun 557 and first capacitor 554 produce a notch filter response at the resonant frequency at the input to the input matching network. As described with respect to FIGS. 5A and 5B, the first capacitor 554 can be a fixed capacitor or a variable capacitor.

As described above, the primary 553 of the RX input balun 557 is configured as a tapped inductor. The primary tap is coupled, via a coupling capacitor 551, to the first terminal of the secondary of the PA balun 420, which is also coupled to the antenna 470. A first terminal of the coupling capacitor 551 is coupled to the first terminal of the secondary of the PA balun 420. The second terminal of the coupling capacitor 551 is coupled to the tap of the primary 553 of the RX input balun 557.

The configuration of the tapped portion of the primary 553 of the RX input balun 557, the coupling capacitor 551, and the first capacitor 554 produces a filter. The filter response provided by this filter can be, for example, a notch filter. The notch filter can provide additional filtering of the signal coupled from the antenna 470 to the secondary of the PA balun 420. The frequency response of the filter can be controlled, for example, by adjusting the value of the coupling capacitor 551, the value of the first capacitor 554, the value of the inductance provided at the tapped input to the primary 553 of the RX input balun 557, or some combination thereof. The shape of the frequency response can be adjusted, for example, by adjusting the Quality factor (Q) of one or more of the coupling capacitor 551, the first capacitor 554, or the inductance provided at the tapped input to the primary 553 of the RX input balun 557.

The value of the first capacitor 554 may be determined based on the value of the inductance of the primary 553 of the RX input balun 557 to provide a notch filter response at a particular frequency. The position of the tap on the primary 553 of the RX input balun 557 can be configured to set the frequency response provided by the additional notch. For example, if the coupling capacitor 551 has relatively insignificant impact on the notch frequency, and if the tap on the primary 553 of the RX input balun 557 is a center tap of the primary 553, then the frequency of the notch provided by the first capacitor 554 and tap on the primary 553 of the RX input balun 557 is twice the frequency of the notch provided by the first capacitor 554 and primary 553 of the RX input balun 557.

In other embodiments, configuring the tap on the primary 553 of the RX input balun 557 and/or the value of the coupling capacitor 551 may position the notch at some other frequency. It may be advantageous for the frequency of the notch to be positioned at a harmonic of the transmit frequency. The harmonic of the transmit frequency can be, for example, the second harmonic, the third harmonic, or some other harmonic.

The secondary 559 of the RX input balun 557 is connected between the source of the LNA transistor 550 and ground. A first terminal of the secondary 559 of the RX input balun 557 is coupled to the source of the LNA transistor 550, and the second terminal of the secondary 559 of the RX input balun is coupled to ground.

The additional receive selectivity provided by the input matching network may be utilized in conjunction with, or independent of, other techniques described herein. In one embodiment, a low side notch introduced in the input matching network may be implemented independent of the high side notch introduced by reconfiguring the capacitor 412 in the output matching network described above in relation to FIGS. 4A and 4B.

In another embodiment, a low side notch introduced in the input matching network may be implemented in conjunction with a high side notch introduced by reconfiguring the capacitor 412 in the output matching network. In such a configuration, the capacitor 412 in the PA 410 output matching network is tuned to a secondary value when the RF front end 500 switches from transmit mode to receive mode. In this manner, the receive selectivity of the RF front end 500 may be maintained or improved relative to prior art configurations, while utilizing fewer parts.

Figure 6A:
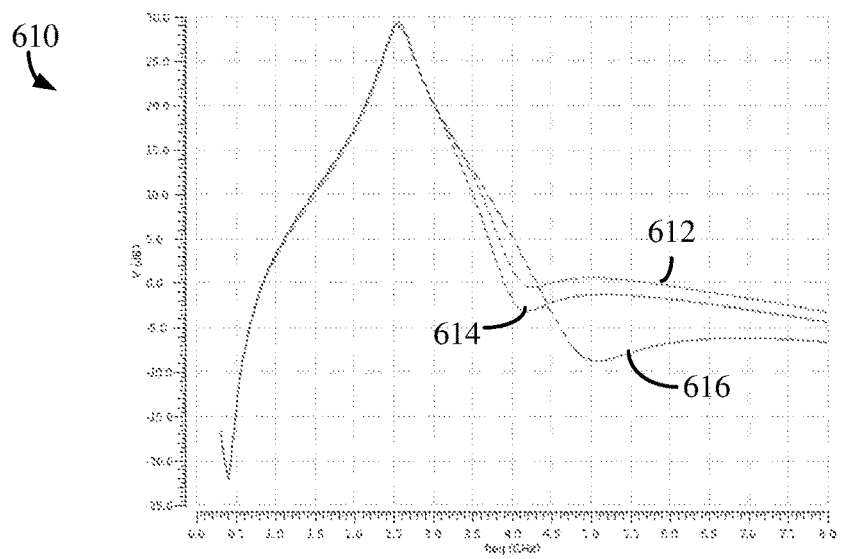
FIGS. 6A-6C are plots illustrating examples of a RF receiver frequency response.
Figure 6B:
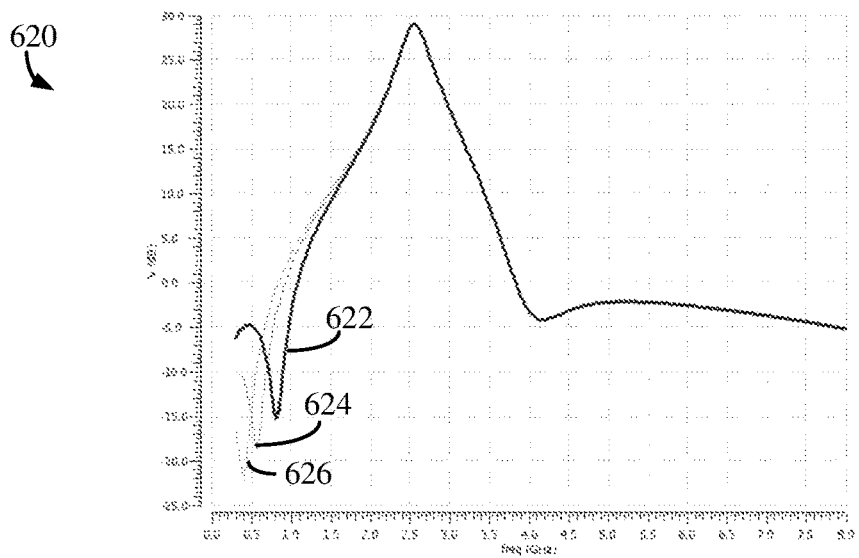
Figure 6C:
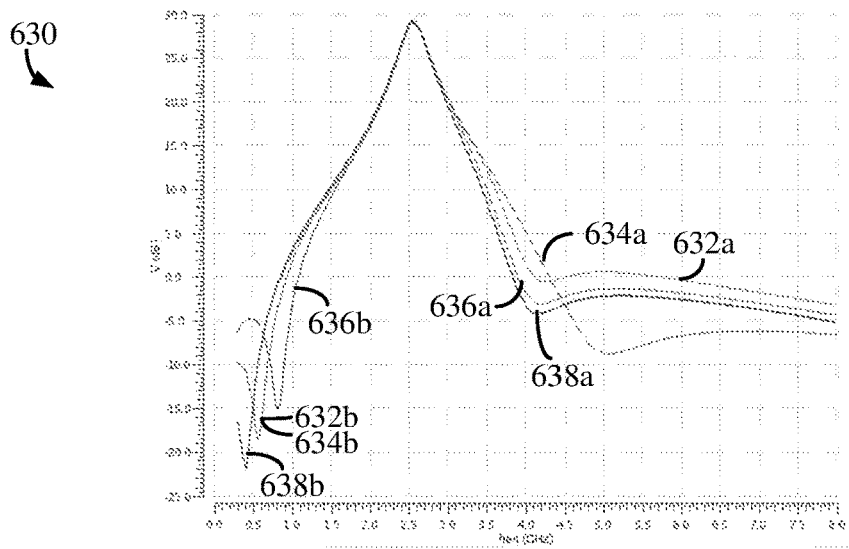

FIGS. 6A-6C are plots illustrating examples of an RF receiver frequency response. FIG. 6A illustrates examples of receive selectivity with an additional high-side notch. FIG. 6B illustrates examples of receive selectivity with an additional low-side notch. FIG. 6C illustrates examples of receive sensitivity with additional high-side notch and low-side notch. The examples illustrate possible attainable receive signal selectivity for an operating band around approximately 2.5 GHz.

FIG. 6A illustrates a plot receive signal selectivity 610 with an additional high-side notch provided by reconfiguring the PA output matching network during receive mode, as illustrated in FIGS. 4A and 4B. Three possible configurations of a high side notch are illustrated in FIG. 6A. Each configuration represents different configurations of the PA output matching network. In each configuration, the value of a capacitance in parallel with a primary winding of an output balun is varied to resonate at a frequency greater than the operating band. In a first configuration 612, the capacitor is tuned to a first value, and the receive selectivity reveals a notch response at approximately 4.2 GHz. The notch is approximately 30 dB below the peak of the operating band. In a second configuration 614, the capacitor is tuned to a second value, and the receive selectivity reveals a notch response at approximately 4.2 GHz. The notch is approximately 33 dB below the peak of the operating band. In a third configuration 616, the capacitor is tuned to a third value, and the receive selectivity reveals a notch response at approximately 5 GHz. The notch is approximately 38 dB below the peak of the operating band. A wireless LAN transceiver operating in the 2.4-2.5 GHz frequency band may utilize this configuration, for example, to improve the rejection of wireless LAN signals around the 5 GHz band. The depth of the notch and the ability to tune the notch depends, in part, on the Q of the elements in the output matching network and the receive selectivity in absence of the notch. Furthermore, the ability to tune the frequency of the notch nearer to the operating band is constrained by a desire to limit additional insertion loss in the operating band contributed by the notch.

FIG. 6B illustrates a plot of examples of receive selectivity 620 with a low-side notch. The low-side notch may be attained, for example, by reconfiguring the PA output matching network as illustrated in FIGS. 4A and 4B. Alternatively, the low-side notch may be attained by configuring the input matching network to the LNA to include a shunt matching elements configured to resonate at the desired frequency of the notch, as illustrated in FIGS. 5A and 5B.

It may be advantageous to implement the low-side notch by configuring the input matching network to the LNA such that the RF front end may benefit from both the low-side notch and a high-side notch provided by reconfiguring the PA output matching network during receive mode. In a first configuration 622, the shunt matching elements of the input matching network, including the shunt inductor and first capacitor, are configured to resonate at approximately 850 MHz. The notch is approximately 45 dB below the peak of the operating band. In a second configuration 624, the shunt inductor and first capacitor are configured to resonate at approximately 700 MHz. The notch is approximately 48 dB below the peak of the operating band. In a third configuration 626, the shunt inductor and first capacitor are configured to resonate at approximately 400 MHz. The notch is approximately 52 dB below the peak of the operating band.

FIG. 6C illustrates a plot of examples of receive sensitivity 630 with additional high-side notch and low-side notch. FIG. 6C illustrates four examples of high-side notch provided by retuning the PA output matching network in combination with three examples of low-side notch provided by configuring shunt matching elements of a LNA input matching network. Because only three examples of low-side notch are illustrated, two of the receive selectivity plots exhibit the same low-side response.

A first example of high-side notch and low-side notch configuration are illustrated by 632a and 632b, respectively. A second example of high-side notch and low-side notch configuration are illustrated by 634a and 634b, respectively. A third example of high-side notch and low-side notch configuration are illustrated by 636a and 636b, respectively. A fourth example of high-side notch and low-side notch configuration are illustrated by 638a and 6368, respectively. The plot of examples of receive sensitivity 630 illustrate the relative independence of the high-side and low-side notch configurations.

Figure 7:
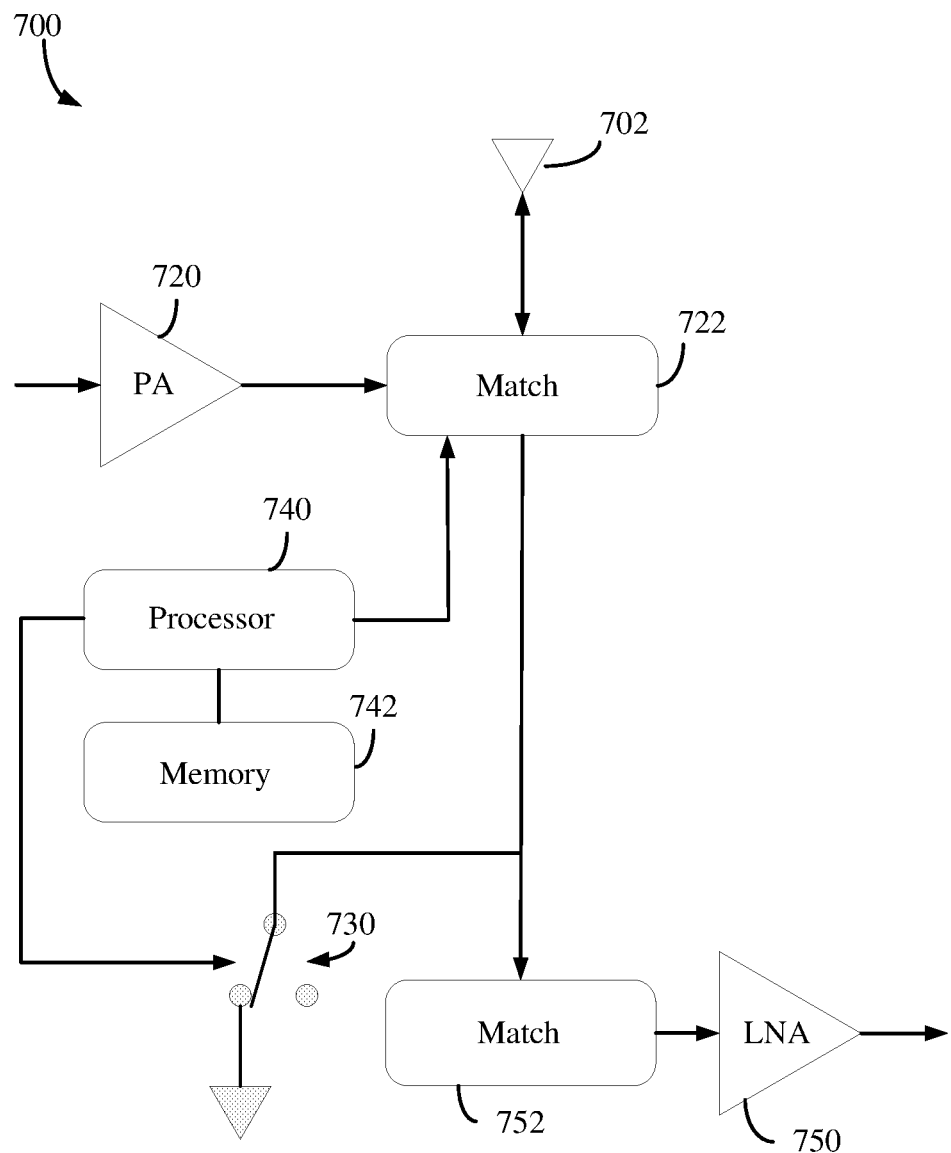
FIG. 7 is a functional block diagram of an example of a TDD RF front end.

FIG. 7 is a functional block diagram of an example of a TDD transceiver RF front end 700. The RF front end 700 may be configured to include the aspects illustrated in FIGS. 4A-4B and 5A-5B to improve receive selectivity.

The RF front end 700 includes an antenna 702 configured to transmit signals from the RF front end 700 and receive signals at the RF front end 700. A transmit portion of the RF front end 700 includes a PA 720 having an output coupled to an output matching network 722. The output matching network 722 can include one or more elements configured to match an impedance at the output of the PA 720 to a characteristic impedance. A transmit signal from the output matching network 722 is coupled to the antenna 702 for transmission to a remote location.

Each of the one or more elements in the output matching network 722 can include one or more passive elements or active elements. Each of the one or more passive elements or active elements can be configured to provide a reactance contributing to the match. At least one of the elements in the output matching network 722 may be a variable element that may be controlled to provide a variable reactance.

At least one element in the output matching network 722 can be configured to couple receive signals from the antenna to an input matching network 752 for a LNA 750. The at least one element in the output matching network 722 can be a secondary of a transformer having a first terminal coupled to the antenna 702. A second terminal of the secondary may be coupled to the input of the input matching network 752.

A primary of the transformer may be coupled to an output of the PA 720. In configurations where the PA 720 provides a balanced output, the transformer can be configured as a balun.

The input matching network 752 can include one or more elements configured to match an impedance at the input of the LNA 750 to a characteristic impedance. Receive signals output from the input matching network 752 are coupled to an input of the LNA 750 for amplification.

Each of the one or more elements in the input matching network 752 can include one or more passive elements or active elements. Each of the one or more passive elements or active elements can be configured to provide a reactance contributing to the match. The input matching network 752 can be configured to include a shunt reactance. The shunt reactance can be configured in series with a second reactance. The shunt reactance and second reactance can be configured to resonate at a frequency. The resonant frequency may be the frequency of a notch response provided by the input matching network 752.

A T/R switch 730 may include a first terminal coupled to a node common to the output matching network 722 and input matching network 752. A second terminal of the T/R switch 730 can be coupled to ground. A third terminal of the T/R switch 730 may be open circuited. Alternatively, the T/R switch may be a single-pole single-throw switch, and the third terminal may be omitted.

A processor 740 in combination with memory 742 are configured to control the operation of the RF front end 700. The processor 740 can be configured to selectively close or open the T/R switch 730 to switch the RF front end 700 between transmit mode and receive mode of operation. In the example illustrated in FIG. 7, the RF front end 700 is configured in transmit mode when the T/R switch 730 is closed, and the RF front end 700 is configured in receive mode when the T/R switch 730 is open.

The processor 740 and memory 742 also combine to control a value of variable reactance provided by an element within the output matching network 722. As an example, the variable reactance element providing the variable reactance may be a variable capacitor. The processor 740 may be configured to control the value of the variable reactance element in dependence on a mode of operation. The processor 740 may control the variable element to have a primary value when the RF front end 700 is configured in transmit mode. The processor 740 may control the variable element to have a secondary value when the RF front end 700 is configured in receive mode.

In one example, the variable element is a variable capacitor configured in parallel to the primary of a transformer within the output matching network 722. The processor 740 can control the variable capacitor to a primary value to present a reactance for matching the output of the PA to a characteristic impedance when the RF front end 700 is configured in the transmit mode. The processor 740 can control the variable capacitor to a secondary value to present a reactance that resonates with at least one other reactive element in the output matching network 722 when the RF front end 700 is configured in the receive mode.

As an example, the processor 740 can control the variable capacitor to resonate with the primary of the transformer during receive mode. The processor 740 can control the variable capacitor to produce a resonant frequency at greater than approximately 1.5 times the operating frequency. In another example, the processor 740 can control the variable capacitor to produce a resonant frequency at greater than approximately 2 times the operating frequency. The processor 740 can be configured, for example, to retrieve a control value from a plurality of control values stored within memory 742. Each control value may correspond to a reactance value of the variable element. At least one control value can be used to represent the primary value, and at least one different control value can be used to represent the secondary value.

Figure 8:
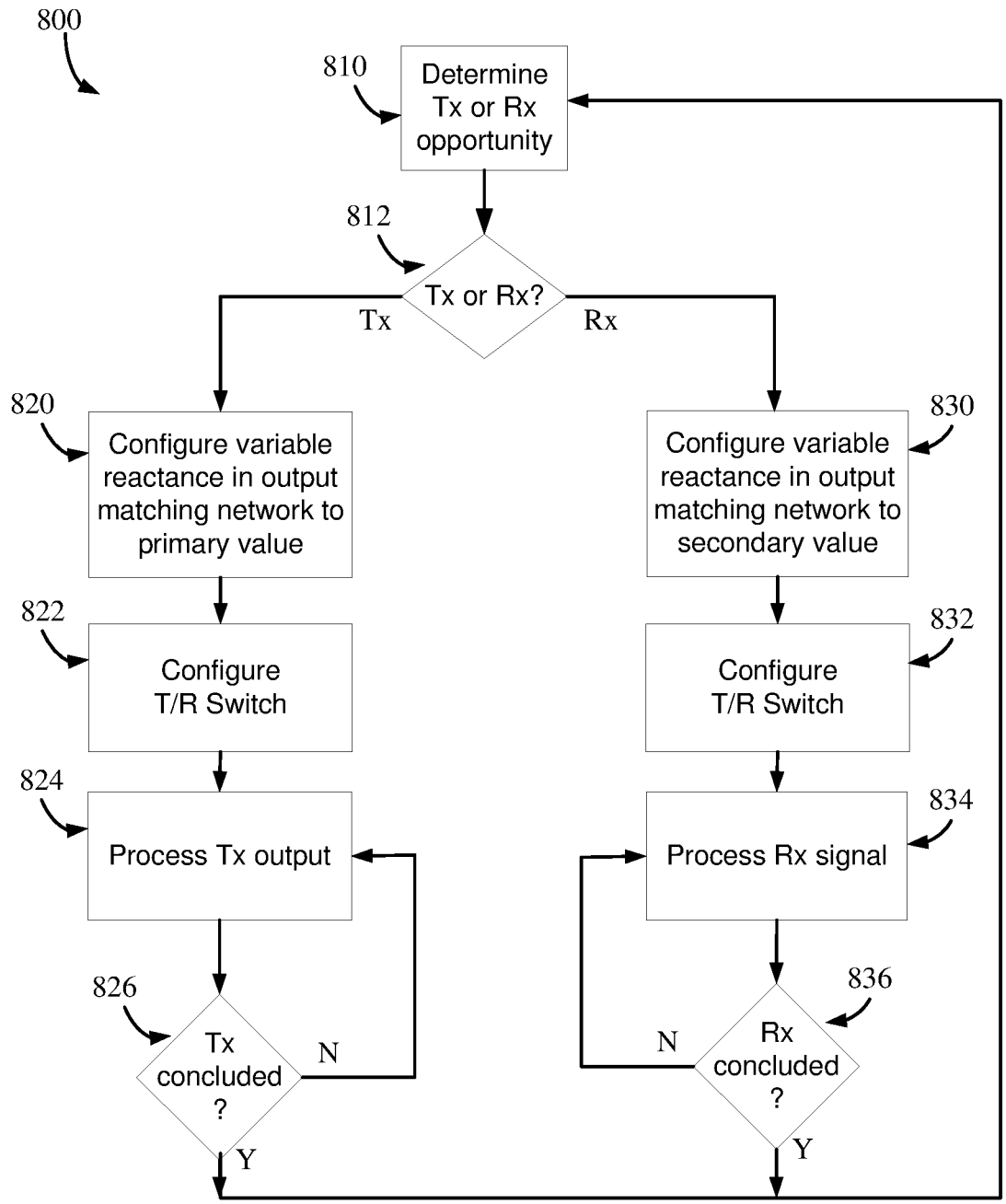
FIG. 8 is a flow chart of an example of a method of controlling a TDD RF front end.

FIG. 8 is a flow chart of an example of a method 800 for controlling a TDD RF front end. The method 800 can be implemented within a RF front end, such as the RF front ends depicted in FIG. 4A, 5A, or 7, to provide increased receive selectivity.

The method 800 begins at block 810, where a processor determines whether a transmit (Tx) or receive (Rx) opportunity is available. In some wireless systems, the Tx and Rx opportunities are scheduled according to a synchronized timeline. In other wireless systems, the Tx and Rx opportunities may be allocated to particular devices to occur at particular times.

Once the processor determines that an opportunity exists, the method proceeds to decision block 812, where the processor determines whether the opportunity is a Tx opportunity or a Rx opportunity. If it is a Tx opportunity, the processor proceeds to block 820.

At block 820, the processor configures the variable reactance element in the Tx PA output matching network to its primary value. As discussed previously, the primary value of the variable reactance element is the value that contributes to achieving the output match from the PA output to a characteristic impedance.

The processor proceeds to block 822 where the processor controls the T/R switch to be in the proper position to place the RF front end in transmit mode. The processor may, for example, control the T/R switch prior to or concurrently with, configuring the variable reactance element. The processor then proceeds to block 824, where the processor in conjunction with the RF front end and other transmit circuitry processes the transmit output.

At decision block 826, the processor checks to see if the transmit opportunity has concluded or is about to conclude. The transmit opportunity may conclude, for example, where a device has no additional information to transmit. Alternatively, the transmit opportunity may conclude when a transmit duration has elapsed.

If the Tx opportunity has not yet concluded, the processor returns to block 824 and transmit processing continues. Alternatively, if the Tx opportunity has concluded or is about to conclude, the processor returns to block 810.

If instead, at decision block 812, the processor determines that a Rx opportunity exists, the processor proceeds to block 830. At block 830, the processor configures the variable reactance element in the Tx PA output matching network to its secondary value. As discussed previously, the secondary value of the variable reactance element is the value that creates a resonance in the output matching network at a frequency above the operating frequency.

The processor proceeds to block 832 where the processor controls the T/R switch to be in the proper position to place the RF front end in receive mode. The processor may, for example, control the T/R switch prior to or concurrently with, configuring the variable reactance element. The processor then proceeds to block 834, where the processor in conjunction with the RF front end and other receive circuitry processes the receive signal.

At decision block 836, the processor checks to see if the receive opportunity has concluded or is about to conclude. The receive opportunity may conclude, for example, when a receive duration has elapsed.

If the Rx opportunity has not yet concluded, the processor returns to block 834 and receive processing continues. Alternatively, if the Rx opportunity has concluded or is about to conclude, the processor returns to block 810.

Apparatus and methods of providing receive selectivity in a TDD RF front end for a RF transceiver of a wireless device are described herein. Receive selectivity may be important in situations where wireless signals outside of the operating band contribute to interference experienced by the RF transceiver.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented unless expressly or necessarily ordered within the claim.

The detailed description set forth below in connection with the appended drawings is intended as a description of various configurations and is not intended to represent the only configurations in which the concepts described herein may be practiced. The detailed description includes specific details for the purposes of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems have been described with reference to various apparatus and methods. These apparatus and methods are described in the detailed description and illustrated in the accompanying drawings by various blocks, modules, components, circuits, steps, processes, algorithms, etc. (collectively referred to as "elements"). Some of these elements may be implemented using electronic hardware, computer software, or any combination thereof. For example, the control of the operating mode and variable reactive element described in relation to FIGS. 7 and 8 may be implemented as electronic hardware, computer software, or any combination thereof. Whether such elements are implemented as hardware or software depends upon the particular application and design constraints imposed on the overall system.

By way of example, in configurations appropriate for implementation as a combination of hardware and software, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, some or all of the control functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), compact disk ROM (CD-ROM) or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

What is claimed is:

1. An RF front end, comprising:
   a Transmit/Receive (T/R) switch, configured to control an operating mode of at least a portion of the RF front end; and
   an output matching network having at least one variable reactance element, the variable reactance element configured to resonate with at least one additional element in the output matching network, at a frequency outside of an operating band, in dependence on the operating mode, and a value of the at least one variable reactance element in dependence on the operating mode, wherein the output matching network comprises:
      a transformer having a primary and a secondary, the secondary coupled to an output of the output matching network, a first terminal of the secondary is coupled to an antenna and a second terminal of the secondary is coupled to a terminal of the T/R switch; and
      wherein the at least one variable reactance element comprises a variable capacitor coupled across the primary of the transformer.

2. The RF front end of claim 1, wherein the variable capacitor consists of at least one element selected from the group consisting of a capacitor bank, a varactor, a MOScap, and a three-terminal transcap.

3. The RF front end of claim 1, further comprising a Power Amplifier (PA), and wherein at least one output of the PA is coupled to a first terminal of the primary of the transformer.

4. The RF front end of claim 3, wherein:
   the PA comprises a balanced output;
   the transformer comprises a balun; and
   wherein a first terminal of the balanced output is coupled to a first terminal of the transformer, and a second terminal of the balanced output is coupled to a second terminal of the transformer.

5. The RF front end of claim 1, further comprising a Power Amplifier (PA) having an output coupled to an input of the output matching network.

6. The RF front end of claim 1, further comprising:
   an input matching network having an input coupled to the second terminal of the secondary; and
   a Low Noise Amplifier (LNA) having an input coupled to an output of the input matching network.

7. The RF front end of claim 6, wherein the input matching network comprises a shunt inductor in series with a capacitor, and wherein the shunt inductor and capacitor resonate at a frequency below the operating band.

8. The RF front end of claim 7, wherein the input matching network is configured to match an input impedance of the LNA to a characteristic impedance within a threshold across the operating band.

9. The RF front end of claim 1, further comprising a processor, the processor configured to adjust the value of the variable reactance element to a primary value during a transmit operating mode and adjust the value of the variable reactance element to a secondary value during a receive operating mode.

10. The RF front end of claim 9, wherein the processor is further configured to control the T/R switch.

11. An RF front end, comprising:
    a Transmit/Receive (T/R) switch, configured to control an operating mode of at least a portion of the RF front end; and
    an output matching network having at least one variable reactance element, the variable reactance element configured to resonate with at least one additional element in the output matching network, at a frequency outside of an operating band, in dependence on the operating mode, and a value of the at least one variable reactance element in dependence on the operating mode, wherein the output matching network comprises:
       a transformer having a primary and a secondary, the secondary coupled to an output of the output matching network; and
       wherein the at least one variable reactance element comprises a variable capacitor coupled across the primary of the transformer,
       wherein the at least one variable reactance element is configured to a primary value during a transmit operating mode, the primary value configured to match an output impedance of an amplifier to a characteristic impedance within a threshold across the operating band.

12. The RF front end of claim 11, wherein the variable reactance element is configured to a secondary value during a receive operating mode, and wherein the variable reactance element is configured to resonate with at least one additional element of the output matching network at a resonant frequency that is greater than the frequency of the operating band.

13. The RF front end of claim 12, wherein the resonant frequency is greater than 1.5 times the frequency of the operating band.

14. A method of controlling an RF front end, the method comprising:
    determining one of a transmit opportunity or a receive opportunity in a Time Division Duplex (TDD) system;
    during a transmit opportunity:
       configuring a variable reactance element in an output matching network to a primary value; and
       configuring a T/R switch to a transmit mode; and
    during a receive opportunity:
       configuring the variable reactance element in the output matching network to a secondary value; and
       configuring the T/R switch to a receive mode, wherein configuring the variable reactance element in the output matching network to the primary value comprises configuring the variable reactance element to the primary value to match an output impedance of an amplifier to a characteristic impedance within a threshold across an operating band.

15. The method of claim 14, wherein configuring the variable reactance element in the output matching network to the secondary value comprises configuring the variable reactance element to resonate with at least one additional element of the output matching network at a resonant frequency greater than a frequency of an operating band.

16. The method of claim 15, wherein the resonant frequency comprises a frequency greater than 1.5 times the frequency of the operating band.

17. The method of claim 15, wherein the variable reactance element comprises a variable capacitor, and wherein the variable capacitor is configured to resonate with a primary of a transformer.

18. The method of claim 14, wherein configuring the variable reactance element comprises configuring a value of a variable capacitor.

19. A method of controlling an RF front end, the method comprising:
   configuring a variable reactance element in an output matching network to a primary value during a transmit mode; and
   configuring, during a receive mode, the variable reactance element in the output matching network to a secondary value to resonate with at least one additional element of the output matching network at a resonant frequency greater than a frequency of an operating band,
   wherein configuring the variable reactance element during the receive mode comprises configuring the value of the variable capacitor to resonate with a primary of a transformer, and
   wherein the transformer comprises a secondary having a second terminal coupled to a terminal of a Transmit/Receive (T/R) switch.

20. The method of claim 19, wherein configuring the variable reactance element in the output matching network during the transmit mode comprises configuring the variable reactance in a Power Amplifier (PA) output matching network.

21. The method of claim 20, wherein configuring the variable reactance element during the transmit mode comprises configuring the variable reactance element to the primary value to match an output impedance of a PA to a characteristic impedance within a threshold across an operating band.

22. The method of claim 19, wherein the transformer comprises a secondary having a first terminal coupled to an antenna.

* * * * *